US008686786B2

(12) United States Patent
Park et al.

(10) Patent No.: US 8,686,786 B2
(45) Date of Patent: Apr. 1, 2014

(54) SEMICONDUCTOR DEVICE AND METHOD FOR DRIVING THE SAME

(75) Inventors: Mun-Phil Park, Gyeonggi-do (KR); Jung-Hwan Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 21 days.

(21) Appl. No.: 13/588,795

(22) Filed: Aug. 17, 2012

(65) Prior Publication Data

US 2013/0257520 A1    Oct. 3, 2013

(30) Foreign Application Priority Data

Mar. 30, 2012  (KR) ........................ 10-2012-0033371

(51) Int. Cl.
*H01H 37/76* (2006.01)
(52) U.S. Cl.
USPC ........................................ 327/525; 327/536
(58) Field of Classification Search
USPC ................................................ 327/525, 526
See application file for complete search history.

(56) References Cited

U.S. PATENT DOCUMENTS

| 6,108,246 A * | 8/2000 | Umezawa et al. ....... 365/189.09 |
| 6,680,873 B2 * | 1/2004 | Muraoka et al. ........... 365/225.7 |
| 7,388,770 B2 * | 6/2008 | Namekawa et al. ............ 365/94 |
| 7,586,788 B2 * | 9/2009 | Mawatari et al. .......... 365/185.2 |
| 7,626,881 B2 * | 12/2009 | Tomita ........................ 365/225.7 |
| 7,710,788 B2 * | 5/2010 | Jeon et al. ................. 365/185.33 |
| 7,924,598 B2 * | 4/2011 | Hase et al. ..................... 365/100 |
| 8,208,317 B2 * | 6/2012 | Kang et al. ............... 365/189.09 |
| 8,248,865 B2 * | 8/2012 | Kaku ........................ 365/189.09 |
| 8,358,555 B2 * | 1/2013 | Cha et al. ................... 365/225.7 |
| 2006/0158923 A1 * | 7/2006 | Namekawa et al. .......... 365/149 |
| 2010/0034031 A1 * | 2/2010 | Kang et al. ............... 365/189.09 |

FOREIGN PATENT DOCUMENTS

| KR | 1020000048943 | 7/2000 |
| KR | 1020100001161 | 1/2010 |

* cited by examiner

*Primary Examiner* — Thomas J Hiltunen
(74) *Attorney, Agent, or Firm* — IP & T Group LLP

(57) ABSTRACT

A semiconductor device includes: a first driving voltage generation unit configured to generate a first driving voltage; a fuse unit coupled between an output node for receiving the first driving voltage and a fuse state sensing node; a driving unit configured to drive the fuse state sensing node with a second driving voltage in response to a control signal; a voltage level control unit configured to generate a voltage level control signal in response to a fuse state sensing signal that corresponds to a voltage level of the fuse state sensing node; and a second driving voltage generation unit configured to control and output a voltage level of the second driving voltage in response to the voltage level control signal. The semiconductor device repeatedly performs a rupture operation by monitoring a fuse state sensing signal.

26 Claims, 5 Drawing Sheets

SEMICONDUCTOR DEVICE AND METHOD FOR DRIVING THE SAME

CROSS-REFERENCE TO RELATED APPLICATIONS

The present application claims priority of Korean Patent Application No. 10-2012-0033371, filed on Mar. 30, 2012, which is incorporated herein by reference in its entirety.

BACKGROUND

1. Field

Exemplary embodiments of the present invention relate to a semiconductor designing technology, and more particularly, to a semiconductor device and a method for driving the same.

2. Description of the Related Art

A semiconductor device, such as a Dynamic Random Access Memory (DRAM) device, often includes a fuse circuit. A fuse circuit is a circuit for inverting a preceding option signal and outputting an inverted signal through a fuse programming process and is used to selectively provide an option signal in a voltage control circuit or a redundancy circuit.

The fuse programming process includes a laser blowing process and an electrical process. The laser blowing process is a method of cutting a fuse with laser beam. The fuse programming process using a laser may be performed in, for example, the wafer stage only before a fabricated semiconductor device is packaged. On the other hand, the electrical process is a method of changing the connection state of a fuse and performing a program operation in a packaged state of a fabricated semiconductor device. According to an example, anti-fuse may be used instead of a fuse.

An anti-fuse has opposite characteristics from a fuse, where an anti-fuse is set to a cut state in the initial stage of fabrication of a semiconductor device and after packaging, its state is switched to a connection state through a program operation. In other words, the anti-fuse starts out in the state of an insulator having as high electrical resistance as M ohms (Ω) in the initial stage of fabrication and is subsequently changed into a conductor having as low resistance such as a few hundreds of ohms (Ω) or lower through a program operation. Here, the physical change of the anti-fuse into a conductor is made by applying a voltage of a designated level or higher to the gap between electrodes, which are two conductive layers, and causing the insulator to be broken down.

FIG. 1 is a block view of a conventional anti-fuse circuit, and FIG. 2 is a block view illustrating an internal structure of a high voltage generation unit shown in FIG. 1.

Referring to FIG. 1, the conventional anti-fuse circuit 100 includes a substrate voltage generation unit 110, an anti-fuse unit 120, a driving unit 130, a high voltage generation unit 140, and a sensing unit 150. The substrate voltage generation unit 110 generates a substrate voltage VBBF. The anti-fuse unit 120 is coupled between an output node of the substrate voltage VBBF and a fuse state sensing node DN01. The driving unit 130 drives the fuse state sensing node DN01 with a high voltage VPP in response to a rupture control signal RUPEN. The high voltage generation unit 140 generates the high voltage VPP. The sensing unit 150 senses a resistance state of the anti-fuse unit 120 and outputs a fuse state sensing signal HIT.

The substrate voltage generation unit 110 may be realized as a charge-pump substrate voltage generation unit, which is described in detail below in connection with the high voltage generation unit 140.

Although the anti-fuse unit 120 is not illustrated in detail in the drawing, the anti-fuse unit 120 may be formed of an NMOS transistor including a gate coupled with the fuse state sensing node DN01, and a source and a drain coupled with the output node of the substrate voltage VBBF.

Also, the driving unit 130 may be formed of an inverter and a PMOS transistor. The inverter inverts the rupture control signal RUPEN and outputs an inverted rupture control signal. The PMOS transistor includes a gate for receiving an output signal of the inverter, and a source and a drain coupled between the output node of the high voltage VPP and the fuse state sensing node DN01.

The high voltage generation unit 140 may be implemented by a charge-pump voltage generation unit, which is described in more detail below with reference to FIG. 2. Referring to FIG. 2, the high voltage generation unit 140 includes a reference voltage generator 141, a voltage detector 143, an oscillator 145, and a pump 147. The reference voltage generator 141 generates a reference voltage VREFP having a designated voltage level. The voltage detector 143 detects a voltage level of the high voltage VPP in comparison with the reference voltage VREFP. The oscillator 145 outputs an oscillation signal OSC corresponding to a voltage detection signal DET that is outputted from the voltage detector 143. The charge-pump 147 generates the high voltage VPP in response to the oscillation signal OSC.

Hereinafter, the operation of the anti-fuse circuit 100 having the above structure is described.

First of all, the substrate voltage generation unit 110 generates the substrate voltage VBBF according to a target level, and the high voltage generation unit 140 generates the high voltage VPP according to a target level. Since the substrate voltage generation unit 110 and the high voltage generation unit 140 may each be realized as a charge-pump voltage generation unit, the high voltage generation unit 140 is representatively described herein as an example. First, when the reference voltage generator 141 generates the reference voltage VREFP corresponding to the high voltage VPP, the voltage detector 143 compares the reference voltage VREFP with the high voltage VPP so as to produce a comparison result and outputs the voltage detection signal DET corresponding to the comparison result. Accordingly, the oscillator 145 outputs the oscillation signal OSC, and the charge-pump 147 generates the high voltage VPP.

In this state, when the rupture control signal RUPEN is enabled at a desired timing, the driving unit 130 drives the fuse state sensing node DN01 with the high voltage VPP. Thus, the high voltage VPP and the substrate voltage VBBF are applied to ends of the anti-fuse unit 120, respectively, and the anti-fuse unit 120 is ruptured due to the voltage level difference between the ends.

Here, the sensing unit 150 senses the resistance state of the anti-fuse unit 120 and outputs the fuse state sensing signal HIT corresponding to the sensed resistance state. In other words, the sensing unit 150 detects that the anti-fuse unit 120 is ruptured when the resistance value of the anti-fuse unit 120 becomes lower than a target resistance value and outputs the fuse state sensing signal HIT corresponding to the detection.

Here, the anti-fuse circuit 100 having the above structure has the following features.

As mentioned above, the anti-fuse unit 120 is ruptured due to the voltage level difference between the ends of the anti-fuse unit 120. However, the rupturing may not be properly performed due to the conditions of process and voltage levels. In this case, an erroneous fuse state sensing signal HIT is outputted, and operation reliability of the anti-fuse circuit 100 deteriorates.

SUMMARY

An embodiment of the present invention is directed to a semiconductor device that repeatedly performs a rupture operation by monitoring a fuse state sensing signal, and a method for driving the semiconductor device.

In accordance with an embodiment of the present invention, a semiconductor device includes: a first driving voltage generation unit configured to generate a first driving voltage; a fuse unit coupled between an output node for receiving the first driving voltage and a fuse state sensing node; a driving unit configured to drive the fuse state sensing node with a second driving voltage in response to a control signal; a voltage level control unit configured to generate a voltage level control signal in response to a fuse state sensing signal that corresponds to a voltage level of the fuse state sensing node; and a second driving voltage generation unit configured to control and output a voltage level of the second driving voltage in response to the voltage level control signal.

In accordance with another embodiment of the present invention, a semiconductor device: a first voltage generation unit configured to generate a first voltage; a fuse unit coupled between an output node for receiving the first voltage and a fuse state sensing node; a driving unit configured to drive the fuse state sensing node with a second voltage in response to a rupture control signal; a voltage level control unit configured to generate a voltage level control signal in response to a detection enable signal and a fuse state sensing signal that corresponds to a voltage level of the fuse state sensing node; and a second voltage generation unit configured to increase and output a voltage level of the second voltage in response to the voltage level control signal.

In accordance with yet another embodiment of the present invention, a method for driving a semiconductor device includes: applying a first voltage and a second voltage to two ends of the fuse unit, respectively; detecting whether the fuse unit is ruptured or not; increasing a voltage level difference between the first voltage and the second voltage, when the fuse unit is not ruptured; and repeating the application of the first voltage and the second voltage, the rupture detection with the increased voltage level difference, and the voltage level difference increase sequentially until the fuse unit is ruptured.

DETAILED DESCRIPTION

Figure 1:
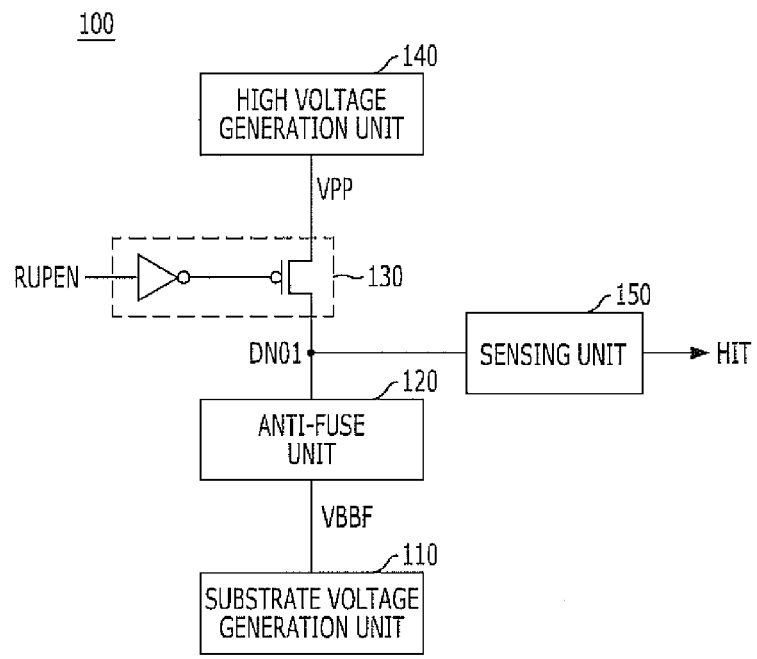
FIG. 1 is a block view of a conventional anti-fuse circuit.
Figure 2:
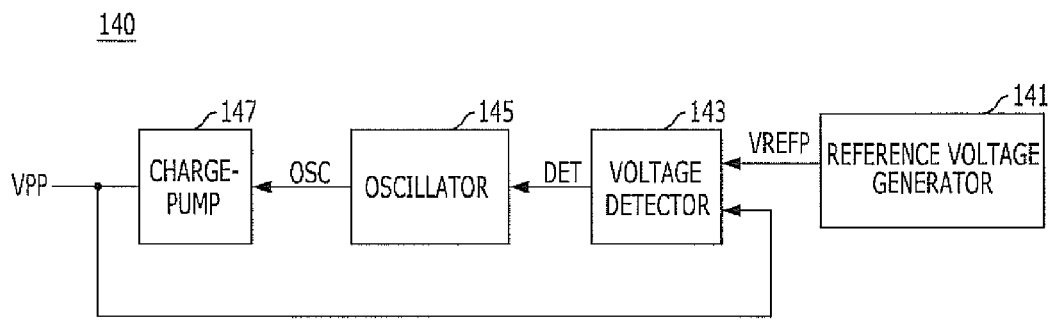
FIG. 2 is a block view illustrating an internal structure of a high voltage generation unit shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
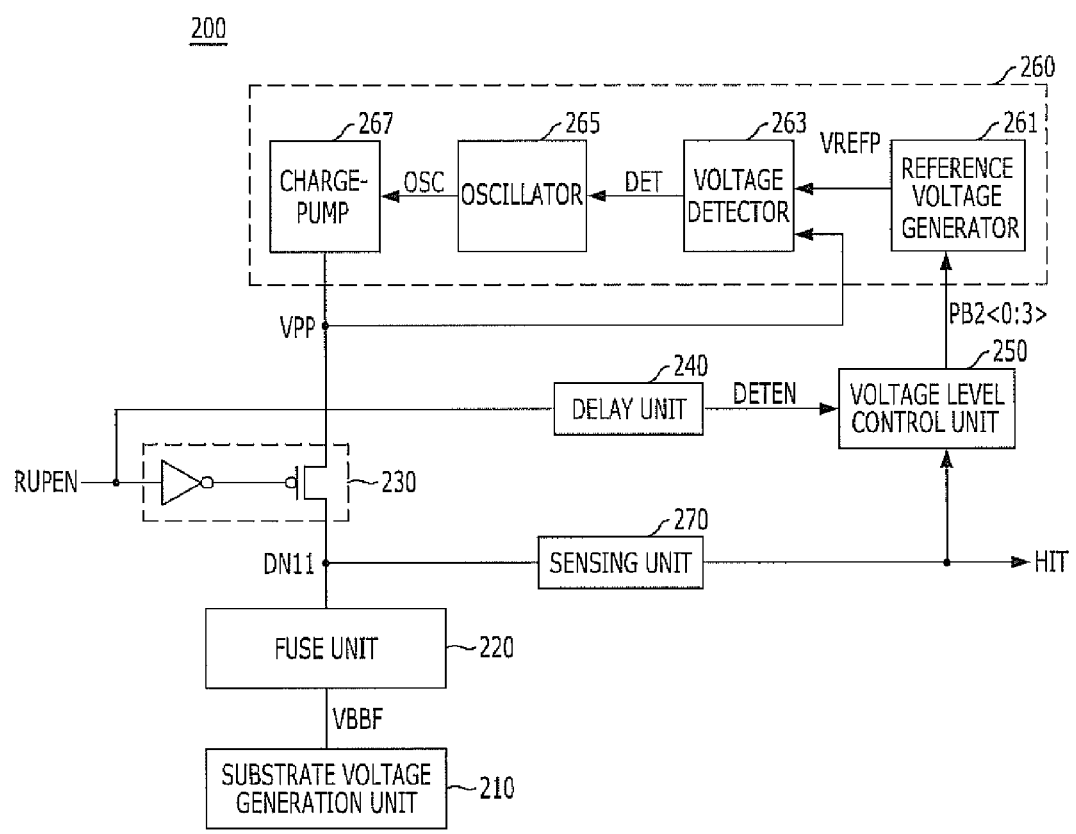
FIG. 3 is a block view of a semiconductor device in accordance with a first embodiment of the present invention.
Figure 4:
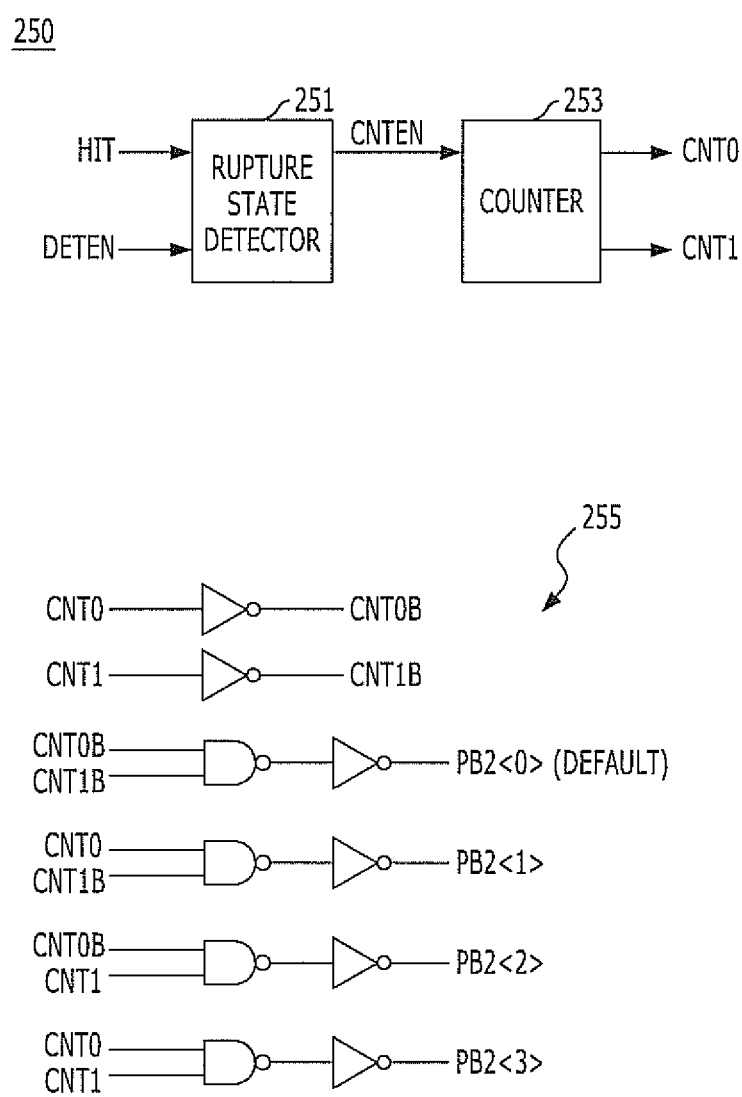
FIG. 4 is a block view illustrating an internal structure of a voltage level controller shown in FIG. 3.
Figure 5:
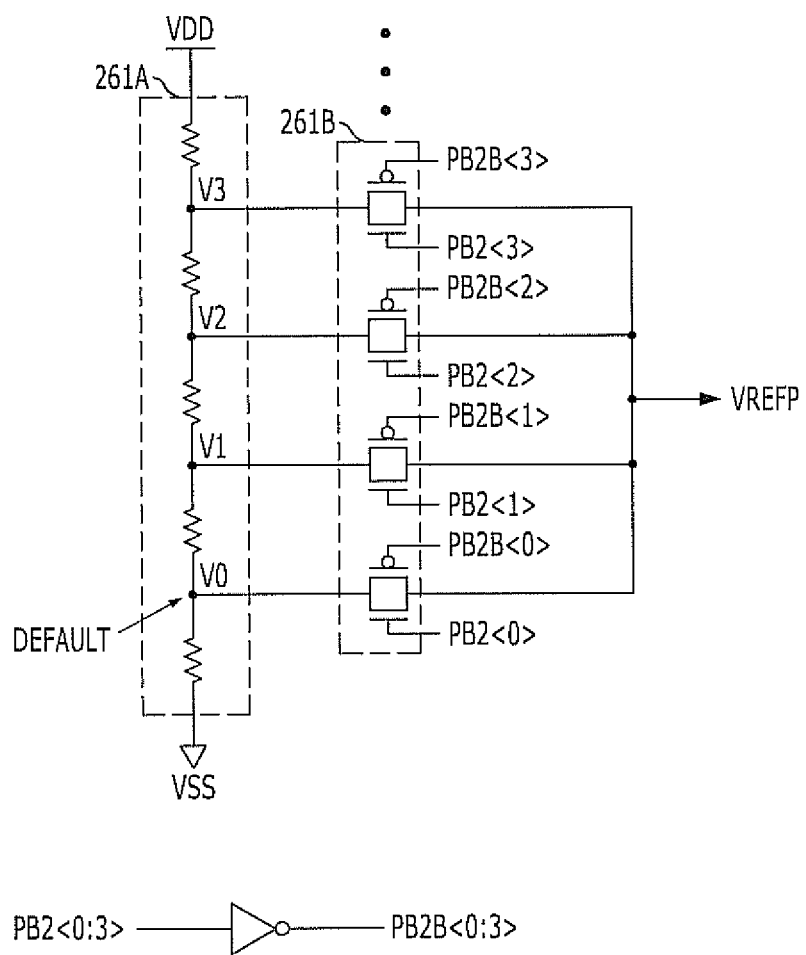
FIG. 5 is a block view illustrating an internal structure of a reference voltage level generation unit shown in FIG. 3.

FIG. 3 is a block view of a semiconductor device in accordance with a first embodiment of the present invention. FIG. 4 is a block view illustrating an internal structure of a voltage level controller shown in FIG. 3. FIG. 5 is a block view illustrating an internal structure of a reference voltage level generation unit shown in FIG. 3.

Referring to FIG. 3, the semiconductor device 200 in accordance with the first embodiment of the present invention includes a substrate voltage generation unit 210, a fuse unit 220, a driving unit 230, a delay unit 240, a voltage level control unit 250, a high voltage generation unit 260, and a sensing unit 270.

The substrate voltage generation unit 210 generates a substrate voltage VBBF. The fuse unit 220 is coupled between an output node of the substrate voltage VBBF and a fuse state sensing node DN11. The driving unit 230 drives the fuse state sensing node DN11 with the high voltage VPP in response to a rupture control signal RUPEN. The delay unit 240 outputs a detection enable signal DETEN by delaying the rupture control signal RUPEN by a desired delay time. The voltage level control unit 250 generates first to fourth voltage level control signals PB2<0>/PB2B<0>, PB2<1>/PB2B<1>, PB2<2>/PB2B<2>, and PB2<3>/PB2B<3> in response to the detection enable signal DETEN and a fuse state sensing signal HIT that corresponds to the voltage level of the fuse state sensing node DN11. The high voltage generation unit 260 increases the voltage level of the high voltage VPP step by step according to the first to fourth voltage level control signals PB2<0>/PB2B<0>, PB2<1>/PB2B<1>, PB2<2>/PB2B<2>, and PB2<3>/PB2B<3> and outputs the increased high voltage. The sensing unit 270 senses the resistance of the fuse unit 220 and outputs the fuse state sensing signal HIT.

Here, the substrate voltage generation unit 210 may be implemented by any reasonably suitable, well-known charge-pump substrate voltage generation unit.

The fuse unit 220 is formed to include an anti-fuse. For example, the fuse unit 220 may be formed of an NMOS transistor including a gate coupled with the fuse state sensing node DN11 and including a source and a drain coupled with an output node of the substrate voltage VBBF.

Also, the driving unit 230 includes an inverter for inverting the rupture control signal RUPEN and outputting an inverted rupture control signal and a PMOS transistor, which includes a gate for receiving an output signal of the inverter and includes a source and a drain coupled between an output node of the high voltage VPP and the fuse state sensing node DN11. Meanwhile, the rupture control signal RUPEN is a signal that toggles at a desired period for a desired duration, and the number of togglings is determined based on the number of times for repeatedly performing a rupture operation. Whether to enable the rupture control signal RUPEN or not is decided in consideration of stress time for rupturing the fuse unit 220. For example, the rupture control signal RUPEN may use an internal signal derived from a self-refresh signal or an external command inputted from the outside.

Also, the delay unit 240 generates the detection enable signal DETEN enabled for a desired duration from the time when the rupture control signal RUPEN transitions from an enable state to a disable state. This is to enable the voltage level control unit 250 after the rupture operation of the fuse unit 220 is sufficiently performed.

Meanwhile, the voltage level control unit 250 is enabled in response to the detection enable signal DETEN and generates the first to fourth voltage level control signals PB2<0>/PB2B<0>, PB2<1>/PB2B<1>, PB2<2>/PB2B<2>, and PB2<3>/PB2B<3> according to whether the fuse unit 220 is ruptured or not by monitoring the fuse state sensing signal HIT. The voltage level control unit 250, as illustrated in FIG. 4, includes a rupture state detector 251, a counter 253, and a decoder 255. The rupture state detector 251 detects whether the fuse unit 220 is ruptured or not in response to the detection enable signal DETEN and the fuse state sensing signal HIT. The counter 253 performs a counting operation in response to a counting enable signal CNTEN that is outputted from the rupture state detector 251. The decoder 255 decodes counting code signals CNT0 and CNT1 that are outputted from the counter 253 and outputs the first to fourth voltage level control signals PB2<0>/PB2B<0>, PB2<1>/PB2B<1>, PB2<2>/PB2B<2>, and PB2<3>/PB2B<3>.

As to components of the voltage level control unit 250, the rupture state detector 251 detects the voltage level of the fuse state sensing signal HIT whenever the detection enable signal DETEN is enabled and selectively enables the counting enable signal CNTEN based on the detection result. For example, the rupture state detector 251 maintains the counting enable signal CNTEN in the disable state when the fuse state sensing signal HIT is in a logic high level, and when the fuse state sensing signal HIT is in a logic low level, the rupture state detector 251 outputs the counting enable signal CNTEN in an enable state for a desired duration. The counter 253 increases the value of counting code signals CNT0 and CNT1 by one whenever the counting enable signal CNTEN is enabled, and when the counting enable signal CNTEN is disabled for a certain duration, it initializes the counting code signals CNT0 and CNT1. For example, the counter 253 initially outputs '00' as a default value of the counting code signals CNT0 and CNT1, and sequentially outputs '01', '10', and '11' as the counting code signals CNT0 and CNT1 whenever the counting enable signal CNTEN is enabled, respectively. Here, when the counting enable signal CNTEN is disabled for a certain duration, the counter 253 initializes the counting code signals CNT0 and CNT1 to '00'. Here, the decoder 255 may be implemented by any reasonably suitable, well-known decoder. If any, the decoder 255 outputs the first to fourth voltage level control signals PB2<0>/PB2B<0>, PB2<1>/PB2B<1>, PB2<2>/PB2B<2>, and PB2<3>/PB2B<3> in response to the counting code signals CNT0 and CNT1. For example, the decoder 255 outputs the first voltage level control signals PB2<0>/PB2B<0> of the default value corresponding to the counting code signals CNT0 and CNT1 of default values.

Referring back to FIG. 3, the high voltage generation unit 260 includes a reference voltage generator 261, a voltage detector 263, an oscillator 265, and a charge-pump 267. The reference voltage generator 261 increases a reference voltage VREFP step by step in response to the first to fourth voltage level control signals PB2<0>/PB2B<0>, PB2<1>/PB2B<1>, PB2<2>/PB2B<2>, and PB2<3>/PB2B<3> and outputs increased reference voltages. The voltage detector 263 detects the voltage level of the high voltage VPP in comparison with the reference voltage VREFP. The oscillator 265 outputs an oscillation signal OSC corresponding to a voltage detection signal DET that is outputted from the voltage detector 263. The charge-pump 267 generates the high voltage VPP in response to the oscillation signal OSC.

Here, the voltage detector 263, the oscillator 265, and the charge-pump 267 may be implemented by any reasonably suitable, well-known voltage detector, oscillator, and charge-pump, respectively. Meanwhile, the reference voltage generator 261 includes a division element 261A and a selection element 261B. The division element 261A is coupled between a first voltage terminal and a second voltage terminal and provides gradually divided first to fourth division voltages V0, V1, V2 and V3 between the first voltage terminal and the second voltage terminal. The selection element 261B selects and outputs any one among the first to fourth division voltages V0, V1, V2 and V3 in response to the first to fourth voltage level control signals PB2<0>/PB2B<0>, PB2<1>/PB2B<1>, PB2<2>/PB2B<2>, and PB2<3>/PB2B<3>. For example, the reference voltage generator 261 outputs the first division voltage V0 that is outputted as the reference voltage VREFP in response to the first voltage level control signals PB2<0>/PB2B<0> at a default level, and sequentially outputs the second to fourth division voltages V1, V2 and V3 as the reference voltage VREFP in response to the second to fourth voltage level control signals PB2<1>/PB2B<1>, PB2<2>/PB2B<2>, and PB2<3>/PB2B<3>.

Hereinafter, a method for driving the semiconductor device 200 in accordance with the first embodiment of the present invention having the above-described structure is described with reference to FIG. 6.

Figure 6:
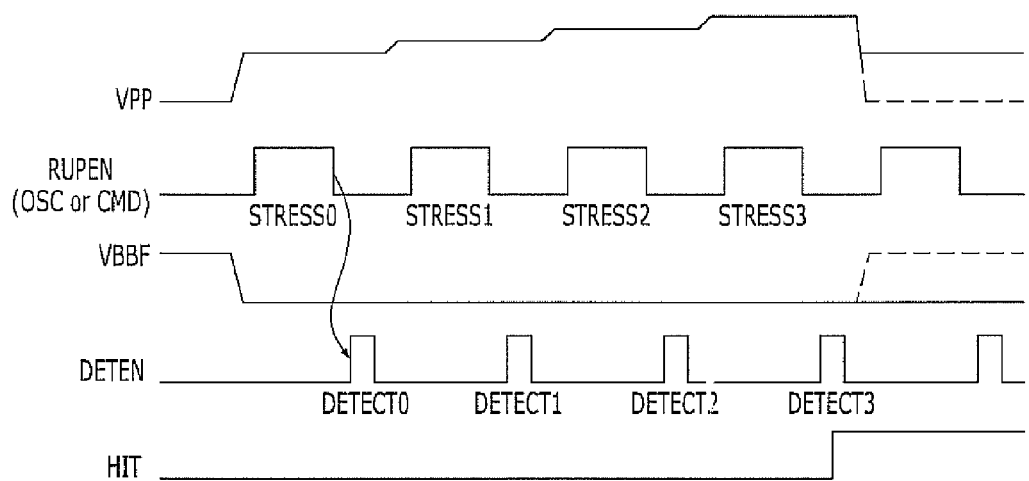
FIG. 6 is a timing diagram describing a method for driving the semiconductor device in accordance with the first embodiment of the present invention.

FIG. 6 is a timing diagram describing a method for driving the semiconductor device in accordance with the first embodiment of the present invention.

Referring to FIG. 6, while the substrate voltage generation unit 210 generates the reference voltage VREFP at a corresponding default level and the high voltage generation unit 260 generates the high voltage VPP at a corresponding default level, the driving unit 230 drives the fuse state sensing node DN11 with the high voltage VPP in response to the first pulse STRESS0 of the rupture control signal RUPEN.

As a result, the high voltage VPP and the substrate voltage VBBF of default levels are applied to the ends of the fuse unit 220, respectively, during a period that the rupture control signal RUPEN is enabled. The sensing unit 270 continually senses the resistance state of the fuse unit 220 and outputs the fuse state sensing signal HIT according to the sensed resistance state.

When the rupture control signal RUPEN is disabled, the delay unit 240 disables the detection enable signal DETEN. In other words, the delay unit 240 enables the detection enable signal DETEN for a desired duration when the rupture control signal RUPEN transitions from an enable state to a disable state. Accordingly, the voltage level control unit 250 is enabled and outputs the first to fourth voltage level control signals PB2<0>/PB2B<0>, PB2<1>/PB2B<1>, PB2<2>/PB2B<2>, and PB2<3>/PB2B<3> in response to the fuse state sensing signal HIT. For example, when the fuse state sensing signal HIT is in a logic high level, the voltage level control unit 250 detects that the fuse unit 220 is properly ruptured and maintains the first voltage level control signals PB2<0>/PB2B<0> in the enable state. On the other hand, when the fuse state sensing signal HIT is in a logic low level, the voltage level control unit 250 detects that the fuse unit 220 is not ruptured and enables the second voltage level control signals PB2<1>/PB2B<1>.

Meanwhile, when the voltage level control unit 250 enables the second voltage level control signals PB2<1>/PB2B<1>, the high voltage generation unit 260 increases the high voltage VPP by a first incremental step. In this state, the driving unit 230 drives the fuse state sensing node DN11 with the high voltage VPP whose voltage level is increased in response to the second pulse STRESS1 of the rupture control signal RUPEN. In other words, greater voltage stress is applied across the fuse unit 220 by increasing the voltage level difference between the ends of the fuse unit 220. While greater stress is applied to the fuse unit 220, the sensing unit 270 continues to monitor the resistance state of the fuse unit 220 and outputs the fuse state sensing signal HIT corresponding to the sensed resistance state. When the rupture control signal RUPEN is disabled again, the delay unit 240 enables the detection enable signal DETEN again. As a result, the voltage level control unit 250 is enabled and outputs the first to fourth voltage level control signals PB2<0>/PB2B<0>, PB2<1>/PB2B<1>, PB2<2>/PB2B<2>, and PB2<3>/PB2B<3> in response to the fuse state sensing signal HIT.

For example, when the fuse state sensing signal HIT is in a logic high level, the voltage level control unit 250 detects that the fuse unit 220 is properly ruptured and the voltage level control unit 250 is initialized by enabling the first voltage level control signals PB2<0>/PB2B<0>. On the other hand, when the fuse state sensing signal HIT is in a logic low level, the voltage level control unit 250 detects that the fuse unit 220 is not ruptured and enables the third voltage level control signals PB2<2>/PB2B<2>. When the voltage level control unit 250 enables the third voltage level control signals PB2<2>/PB2B<2>, the high voltage generation unit 260 additionally increases the high voltage VPP by a second incremental step.

As described above, the method includes a process of rupturing the fuse unit 220 by applying the high voltage VPP and the substrate voltage VBBF to the ends of the fuse unit 220, respectively, for a desired duration, a process of detecting whether the fuse unit 220 is ruptured or not, a process of increasing the voltage level difference between the high voltage VPP and the substrate voltage VBBF by increasing the voltage level of the high voltage VPP by an incremental step when it turns out that the fuse unit 220 is not ruptured, and a process of repeatedly performing the above processes until the fuse unit 220 is ruptured. Meanwhile, when the fuse unit 220 is ruptured, the high voltage VPP is initialized to the default level to program the other fuse units (not shown); when the fuse unit 220 is ruptured and there is no more fuse unit to be programmed, the operation for generating the high voltage VPP and the substrate voltage VBBF is terminated. Here, the high voltage VPP may have a voltage level of a source, which may be VDD, or a normal high voltage VPP, whereas the substrate voltage VBBF may have a voltage level of a source, which may be VSS, or a normal substrate voltage VBBF.

Figure 7:
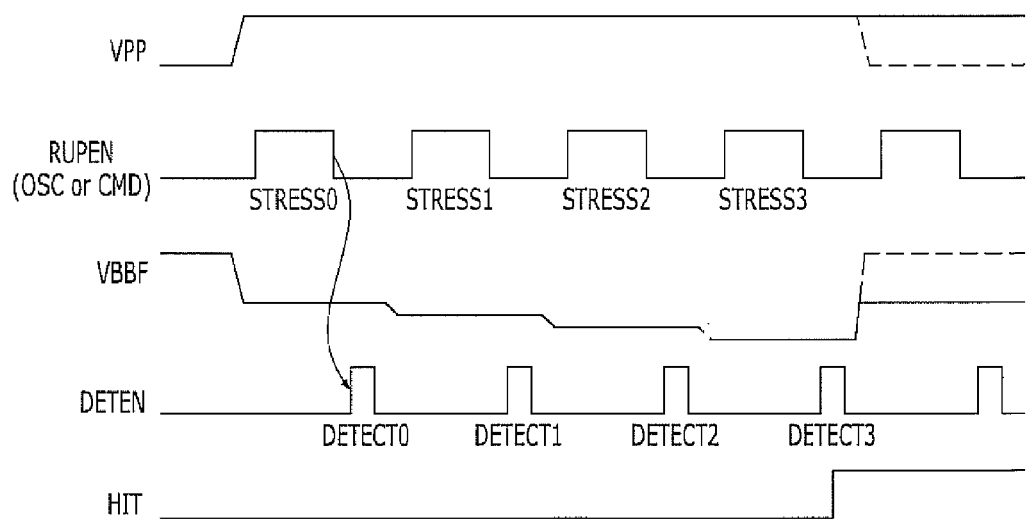
FIG. 7 is a timing diagram describing a method for driving the semiconductor device in accordance with the second embodiment of the present invention.

Although a case where the voltage level of the high voltage VPP is increased when the voltage level difference between the high voltage VPP and the substrate voltage VBBF is raised has been illustrated, exemplary embodiments of the present invention are not limited thereto. For example, as illustrated in FIG. 7, which is a timing diagram describing a method for driving the semiconductor device in accordance with the second embodiment of the present invention, the voltage level difference between the high voltage VPP and the substrate voltage VBBF may be raised by decreasing the voltage level of the substrate voltage VBBF incrementally at each step in response to each pulse of the rupture control signal RUPEN until the fuse unit ruptures. Here, the voltage level of the substrate voltage VBBF may be decreased incrementally in response to each pulse of the rupture control signal RUPEN, where a configuration of a charge-pump circuit for generating the substrate voltage VBBF may be designed based on FIGS. 3 to 5 but after making appropriate changes.

Also, in increasing the voltage level difference between the high voltage VPP and the substrate voltage VBBF, the voltage level difference may be increased by simultaneously increasing the high voltage VPP and decreasing the substrate voltage VBBF in response to the fuse state sensing signal HIT or changing just one of the two voltages, where the high voltage VPP and the substrate voltage VBBF are generated by respective charge pumps having, which have the above-described configurations and are each responsive to the fuse state sensing signal HIT to increase or decrease, respectively, its output voltage (VPP or VBBF). According to an embodiment of the present invention, a rupture failure of a fuse unit may be prevented by repeatedly performing a rupture operation after detecting whether the driving unit is ruptured or not.

According to an embodiment of the present invention, a semiconductor device may produce a proper output by repeatedly performing a rupture operation according to a detection result as to whether a fuse unit is ruptured or not. In this way, the operation reliability of the semiconductor device including the fuse unit may be improved.

While the present invention has been described with respect to the specific embodiments, it will be apparent to those skilled in the art that various changes and modifications may be made without departing from the spirit and scope of the invention as defined in the following claims.

For example, while an exemplary embodiment of the present invention illustrates a case where the voltage level of a supplied voltage is adjusted in four separate steps, exemplary embodiments of the present invention are not limited thereto, and the voltage level of the supplied voltage may be adjusted in a different number of steps.

What is claimed is:

1. A semiconductor device, comprising:
a first driving voltage generation unit configured to generate a first driving voltage;
a fuse unit coupled between an output node for receiving the first driving voltage and a fuse state sensing node;
a driving unit configured to drive the fuse state sensing node with a second driving voltage in response to a control signal;
a voltage level control unit configured to generate a voltage level control signal in response to a fuse state sensing signal that corresponds to a voltage level of the fuse state sensing node; and
a second driving voltage generation unit configured to control and output a voltage level of the second driving voltage in response to the voltage level control signal.

2. The semiconductor device of claim 1, wherein the control signal is a periodic signal and the voltage level control unit is configured to incrementally increase a magnitude of the second driving voltage in response to each pulse of the periodic signal until the fuse state sensing signal indicates that the fuse unit has a target state.

3. The semiconductor device of claim 2, wherein the control signal comprises a signal derived from a self-refresh signal or an external command inputted from outside the semiconductor device.

4. The semiconductor device of claim 1, wherein the first driving voltage generation unit is configured to control and output a voltage level of the first driving voltage in response to the voltage level control signal.

5. The semiconductor device of claim 1, wherein the voltage level control unit is configured to enable a change of the voltage level control signal in response to the control signal.

6. The semiconductor device of claim 5, wherein the voltage level control unit is configured to enable the change of the voltage level control signal after the control signal transitions from an enable state to a disable state.

7. The semiconductor device of claim 1, wherein the fuse unit comprises an anti-fuse.

8. The semiconductor device of claim 7, further comprising:
   a sensing unit configured to sense a resistance state of the fuse unit and output the fuse state sensing signal.

9. A semiconductor device, comprising:
   a first voltage generation unit configured to generate a first voltage;
   a fuse unit coupled between an output node for receiving the first voltage and a fuse state sensing node;
   a driving unit configured to drive the fuse state sensing node with a second voltage in response to a rupture control signal;
   a voltage level control unit configured to generate a voltage level control signal in response to a detection enable signal and a fuse state sensing signal that corresponds to a voltage level of the fuse state sensing node; and
   a second voltage generation unit configured to increase and output a voltage level of the second voltage in response to the voltage level control signal.

10. The semiconductor device of claim 9, wherein the rupture control signal is a periodic signal and the voltage level control unit is configured to incrementally increase a magnitude of the second voltage in response to each pulse of the periodic signal until the fuse state sensing signal indicates that the fuse unit has a target state.

11. The semiconductor device of claim 10, wherein the rupture control signal comprises a signal derived from a self-refresh signal or an external command inputted from outside the semiconductor device.

12. The semiconductor device of claim 9, wherein the first voltage generation unit is configured to decrease and output a voltage level of the first voltage in response to the voltage level control signal.

13. The semiconductor device of claim 12, wherein the low voltage comprises a substrate voltage.

14. The semiconductor device of claim 9, wherein the voltage level control unit comprises:
   a rupture state detector for detecting whether the fuse unit is ruptured or not in response to the detection enable signal and the fuse state sensing signal;
   a counter for performing a counting operation in response to a counting enable signal outputted from the rupture state detector; and
   a decoder for decoding a counting code signal outputted from the counter and outputting the voltage level control signal.

15. The semiconductor device of claim 14, wherein the counter is configured to increase a value of a count output by one when the counting enable signal is enabled and reset the counter when the counting enable signal is disabled for more than a first period of time.

16. The semiconductor device of claim 9, wherein the second voltage generation unit comprises a charge-pump for generating the second voltage.

17. The semiconductor device of claim 16, wherein the second voltage generation unit comprises:
   a reference voltage generator for increasing and outputting a reference voltage in response to the voltage level control signal;
   a voltage detector for detecting a voltage level of the second voltage in comparison with the reference voltage;
   an oscillator for outputting an oscillation signal that corresponds to a second voltage detection signal outputted from the second voltage generation unit; and
   the charge-pump for generating the second voltage in response to the oscillation signal.

18. The semiconductor device of claim 17, wherein the reference voltage generator comprises:
   a division element coupled between a first voltage terminal and a second voltage terminal and providing a plurality of divided voltages obtained by dividing a voltage difference between a first voltage of the first voltage terminal and a second voltage of the second voltage terminal; and
   a selection element for outputting a selected one of the divided voltages as the reference voltage in response to the voltage level control signal.

19. The semiconductor device of claim 9, further comprising:
   a delay unit configured to delay the rupture control signal and output the delayed rupture control signal as the detection enable signal.

20. The semiconductor device of claim 9, wherein the fuse unit comprises an anti-fuse.

21. The semiconductor device of claim 20, further comprising:
   a sensing unit configured to sense a resistance state of the fuse unit and output the fuse state sensing signal.

22. A method for driving a semiconductor device, comprising:
   applying a first voltage and a second voltage to two ends of the fuse unit, respectively;
   detecting whether the fuse unit is ruptured or not;
   increasing a voltage level difference between the first voltage and the second voltage, when the fuse unit is not ruptured; and
   repeating the application of the first voltage and the second voltage, the rupture detection with the increased voltage level difference, and the voltage level difference increase sequentially until the fuse unit is ruptured.

23. The method of claim 22, wherein the increasing of the voltage level difference between the first voltage and the second voltage includes increasing the first voltage.

24. The method of claim 22, wherein the increasing of the voltage level difference between the first voltage and the second voltage includes decreasing the second voltage.

25. The method of claim 22, wherein the increasing of the voltage level difference between the first voltage and the second voltage includes increasing the first voltage and decreasing the second voltage.

26. The method of claim 22, further comprising initializing the first and second voltages to initial voltage levels after the fuse unit is ruptured.

* * * * *